(12) United States Patent
Goodman et al.

(10) Patent No.: US 6,879,777 B2
(45) Date of Patent: Apr. 12, 2005

(54) LOCALIZED HEATING OF SUBSTRATES USING OPTICS

(75) Inventors: Matthew G. Goodman, Chandler, AZ (US); Tony J Keeton, Mesa, AZ (US); Ravinder Aggarwal, Gilbert, AZ (US); Mark Hawkins, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 57 days.

(21) Appl. No.: 10/265,519

(22) Filed: Oct. 3, 2002

(65) Prior Publication Data

US 2004/0067052 A1 Apr. 8, 2004

(51) Int. Cl.[7] ................................. F26B 3/30
(52) U.S. Cl. .................. 392/411; 392/416; 392/418; 219/390; 219/405; 219/411; 118/724; 118/725
(58) Field of Search ............................. 219/390, 405, 219/411; 118/724, 725, 50.1; 392/416, 418, 411

(56) References Cited

U.S. PATENT DOCUMENTS

| | | | |
|---|---|---|---|
| 4,101,759 A | 7/1978 | Anthony et al. | |
| 4,382,776 A | 5/1983 | Kawase et al. | |
| 4,500,642 A | 2/1985 | Reiji et al. | |
| 4,550,684 A | 11/1985 | Mahawili | |
| 4,755,654 A * | 7/1988 | Crowley et al. | ............ 219/405 |
| 4,828,224 A | 5/1989 | Crabb et al. | |
| 4,836,138 A | 6/1989 | Robinson et al. | |
| 5,308,446 A | 5/1994 | Bihuniak et al. | |
| 5,399,523 A | 3/1995 | Kakoschke | |
| 5,452,396 A | 9/1995 | Sopori | |
| 5,532,457 A | 7/1996 | Cobb et al. | |
| 5,561,735 A | 10/1996 | Camm | |
| 5,569,979 A | 10/1996 | Scott et al. | |
| 5,572,091 A | 11/1996 | Langer et al. | |
| 5,584,934 A | 12/1996 | Lin | |
| 5,790,736 A | 8/1998 | Fabian | |
| 5,960,158 A | 9/1999 | Gat et al. | |
| 5,991,508 A | 11/1999 | Ohmine et al. | |
| 6,021,152 A | 2/2000 | Olsen et al. | |
| 6,084,213 A | 7/2000 | Kohave et al. | |
| 6,150,006 A | 11/2000 | Hellmann et al. | |
| 6,437,290 B1 * | 8/2002 | Shao et al. | ................. 219/390 |
| 6,600,138 B2 * | 7/2003 | Hauf et al. | ................. 219/411 |

* cited by examiner

Primary Examiner—Shawntina Fuqua
(74) Attorney, Agent, or Firm—Knobbe Martens Olson & Bear LLP

(57) ABSTRACT

An apparatus for processing a semiconductor substrate, including a process chamber having a plurality of walls and a substrate support to support the substrate within the process chamber. A radiative heat source is positioned outside the process chamber to heat the substrate through the walls when the substrate is positioned on the substrate support. In some embodiments, lenses are positioned between the heat source and the substrate to focus or diffuse radiation from the heat source and thereby selectively alter the radiation intensity incident on certain portions of the substrate. In other embodiments, diffusing surfaces are positioned between the heat source and the substrate to diffuse radiation from the heat source and thereby selectively reduce the radiation intensity incident on certain portions of the substrate.

21 Claims, 5 Drawing Sheets

US 6,879,777 B2

LOCALIZED HEATING OF SUBSTRATES USING OPTICS

FIELD OF THE INVENTION

The present invention relates to temperature control of semiconductor substrates during processing and, more particularly, to controlling the temperature of localized areas of semiconductor substrates during processing.

BACKGROUND OF THE INVENTION

Chemical vapor deposition (CVD) is a well known process in the semiconductor industry for forming thin films of materials on substrates, such as silicon wafers. In a CVD process, a substrate is placed on a substrate support inside a process chamber of a reactor. The substrate is heated, and gaseous precursors of the material to be deposited are flowed into the process chamber to form a thin layer of the material on the substrate by chemical reaction. Semiconductor devices can be formed from the deposited layers.

As semiconductor devices become smaller, requirements for the uniformity of thickness of the deposited layers have become increasingly stringent. In addition, the industry has increasingly been attempting to maximize the useable area of each substrate by reducing the size of the so-called edge exclusion zone at the edge portion of the substrate. Whereas in the past, for example, a typical industry specification might have required a thickness variation of less than 3 percent with an edge exclusion zone of no more than 10 mm on a 150 mm substrate, current industry specifications might require a thickness variation of less than 1 percent with an edge exclusion zone of no more than 3 mm on a 300 mm substrate.

The growth rate, or rate of deposit, of a layer of material in a CVD process is dependent on a number of different process parameters, including the mass flow rate of the gaseous precursors of the material into the process chamber and the temperature of the substrate. At high temperatures, the growth rate is often limited by the mass flow rate of the gaseous precursors into the process chamber. In such cases, the growth rate is said to be mass-transport limited (mass-transport regime). Accordingly, small temperature variations across the substrate have only a minimal effect on the thickness uniformity of the deposited layer.

At lower temperatures, however, the growth rate often primarily depends on temperature. In such cases, the growth rate is said to be reaction rate limited (kinetic regime). Accordingly, small temperature variations across the substrate can have a significant effect on thickness uniformity. A typical low temperature process yields a 2 percent to 3 percent variation in thickness/° C. A large number of the new reactors currently being sold are designed for these lower temperature, reaction rate limited deposition processes. Examples of such reaction rate limited processes include silicon germanium, selective silicon germanium, and silicon germanium carbon deposition processes using either silane ($SiH_4$) or DCS at temperatures between about 500° C. and 800° C.

A variety of heat sources have been used for heating substrates in CVD reactors, including resistive, inductive, and radiative heat sources. Of these, radiative heat sources are the most common, in part because of the ease and efficiency with which they allow for temperature cycling. Radiative heat sources typically comprise a number of infrared heating lamps positioned outside of the process chamber of the reactor. Radiation from the heating lamps is transmitted through the walls of the process chamber, which typically comprise quartz, to heat a substrate supported within the chamber.

The heating lamps can be arranged in the reactor in a manner that facilitates controlling the temperature at selected locations in the process chamber. For example, in one exemplary arrangement, a first array of linear heating lamps is arranged in parallel above the substrate, and a second array of heating lamps is arranged transversely to the first array below the substrate. See, e.g., U.S. Pat. No. 4,975,651, issued Dec. 4, 1990, which is hereby incorporated by reference herein. By adjusting the power delivered to a particular lamp or group of lamps, the temperature at selected locations in the process chamber can, to some extent, be controlled.

Process engineers have been somewhat successful in using this and various other techniques to obtain a generally uniform deposition thickness over the interior portion of the substrate. FIG. 1 illustrates a typical deposition profile for a 200 mm substrate using current hardware and processing techniques. As illustrated in FIG. 1, the deposition thickness over the interior portion of the substrate is relatively uniform. However, the deposition thickness at the edge portion of the substrate is considerably less than the deposition thickness at the interior of the substrate. Conversely, the deposition thickness at the portion of the substrate just inward of the edge portion is greater than the deposition thickness at the interior portion of the substrate. This decrease in deposition thickness at the outer peripheral edge of the substrate, and increase in deposition thickness inward of the outer peripheral edge, is commonly referred to as edge rolloff.

Edge rolloff is likely due to a number of different factors, including the increased surface area to volume ratio at the edge of the substrate, which allows the edge of the substrate to cool faster than the interior of the substrate. To offset the factors contributing to edge rolloff, process engineers have increased power to the heating lamps positioned above and below the edge portion of the substrate. While this has been somewhat effective in increasing the deposition thickness at the edge portion of the substrate, however, due to the large distance between the lamps and the substrate, it has also had the undesired effect of increasing the deposition thickness inward of the edge portion of the substrate. Accordingly, the problem of edge rolloff has not been sufficiently remedied by the current hardware and processing techniques.

SUMMARY OF THE INVENTION

Accordingly, a need exists for a method and apparatus for reducing edge rolloff in CVD processes and, consequently, minimizing the required edge exclusion zone to achieve desired layer thickness uniformity in processed substrates.

In accordance with one aspect of the present invention, an apparatus for processing a semiconductor substrate is provided. The apparatus comprises a process chamber having a plurality of walls and a substrate support to support the substrate within the process chamber. A radiative heat source is positioned outside the process chamber to heat the substrate through the walls when the substrate is positioned on the substrate support. A lens is provided between the heat source and the substrate when the substrate is positioned on the substrate support. The lens selectively affects the intensity of radiation from the heat source incident on a portion of the substrate.

In accordance with another aspect of the present invention, an apparatus for processing a semiconductor substrate is provided. The apparatus comprises a process chamber having a plurality of walls and a substrate support to support the substrate within the process chamber. A radiative heat source is positioned outside the process chamber to heat the substrate through the walls when the substrate is positioned on the substrate support. A diffusing surface is provided on a portion of at least one of the walls. The diffusing surface diffuses radiation from the heat source to selectively reduce the intensity of radiation incident on a portion of the substrate.

In accordance with another aspect of the present invention, an apparatus for processing a semiconductor substrate is provided. The apparatus comprises a process chamber having a plurality of walls and a substrate support to support the substrate within the process chamber. A radiative heat source is positioned outside the process chamber to heat the substrate through the walls when the substrate is positioned on the substrate support. Means are provided for altering the intensity of radiation from the heat source incident on a portion of the substrate relative to another portion of the substrate.

In accordance with another aspect of the present invention, a method of processing a semiconductor substrate is provided. The method comprises providing a reactor comprising a process chamber having a plurality of walls, a substrate support positioned in the process chamber, and a radiative heat source positioned outside the process chamber. A substrate is positioned on the substrate support. At least one of the walls is altered to affect the intensity of radiation received at one portion of the substrate relative to another portion of the substrate. The substrate is then heated with the heat source.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENT

Figure 2:
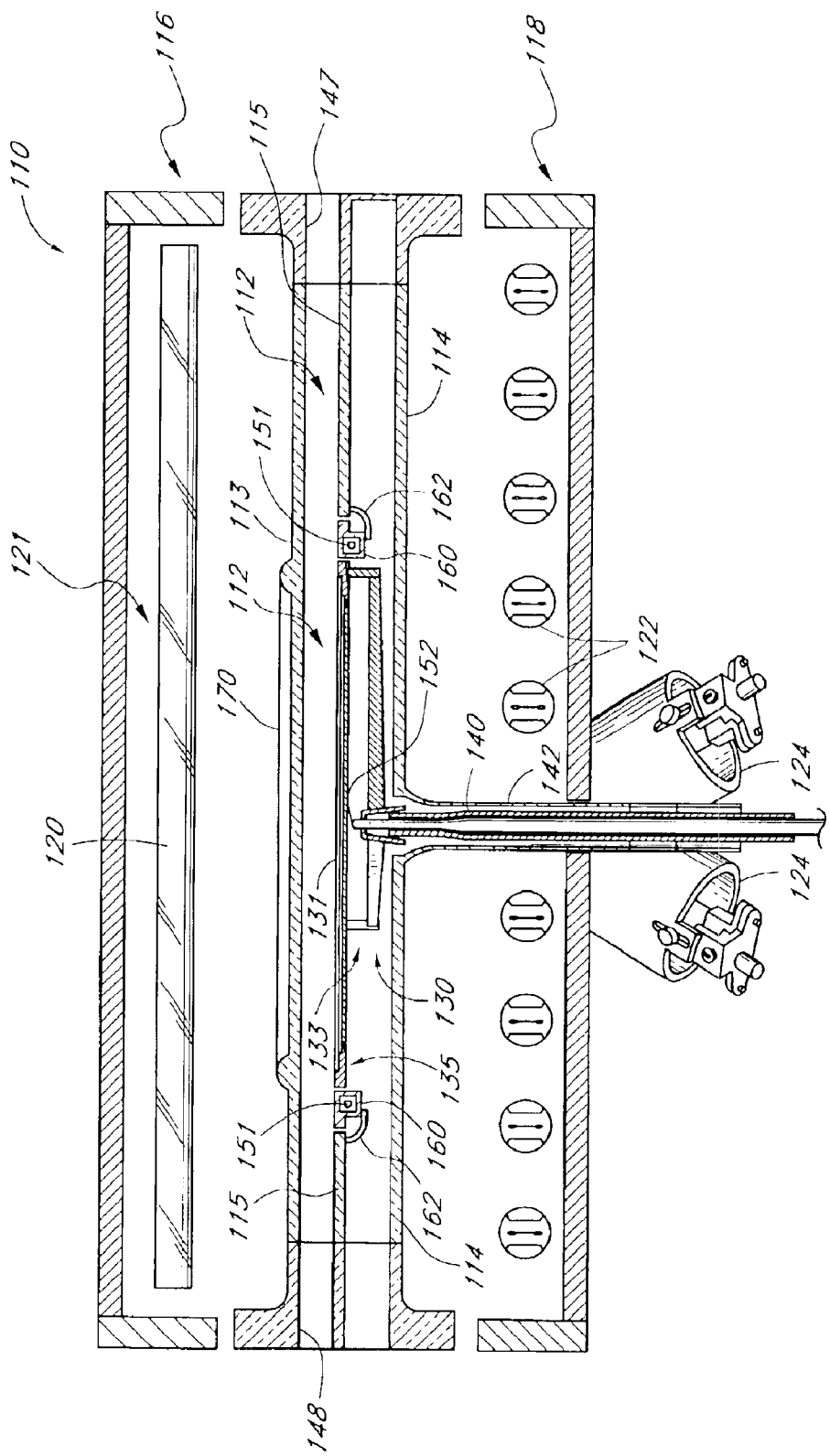
FIG. 2 is a schematic cross-sectional view of a first embodiment of a reactor having certain features and advantages in accordance with the present invention.

FIG. 2 illustrates one exemplary embodiment of a chemical vapor deposition (CVD) reactor 110, including a process chamber 112 of the horizontal-flow type. While the illustrated reactor 110 is a CVD reactor, the skilled artisan will readily appreciate that the principles and advantages taught herein are also applicable to other types of semiconductor processes and processing tools. For example, temperature control can also be important for etching, diffusion, annealing, oxidation, nitridation, dopant activation, photolithography, sputter depositions, etc.

The process chamber 112 is defined, in part, by a transparent (e.g., quartz) upper wall 113 and lower wall 114. A radiative heat source 121 is provided within the reactor 110 outside the chamber 112 to provide heat energy to the chamber 112. In the illustrated embodiment, the radiative heat source 121 comprises an upper heating assembly 116 and a lower heating assembly 118. The upper heating assembly 116 comprises a plurality of elongated tube-type radiative heating lamps 120. The heating lamps 120 of the upper heating assembly 116 are preferably spaced-apart and disposed substantially parallel to the reactant gas flow path through the underlying process chamber 112. The lower heating assembly 118 similarly comprises a plurality of elongated tube-type radiative heating lamps 122 arranged below the process chamber 112 and preferably oriented transversely to the heating lamps 120 of the upper heating assembly 116. A number of spot lamps 124 desirably are provided below the process chamber 112 to focus radiant heat on the underside of a wafer or substrate 131 located within the process chamber 112. The spot lamps 124 serve to counteract any heat-sink effect created by the massive structures extending through the bottom of the reactor 110.

In the exemplary reactor 110 of FIG. 2, the upper heating assembly 116 comprises nine heating lamps 120, each of about 6 kW maximum power. The lower heating assembly 118 similarly comprises nine heating lamps 122, each of about 6 kW maximum power. Four spot lamps 124, each of about 1 kW maximum power, are provided below the process chamber 112. Accordingly, the maximum power of the illustrated exemplary single substrate reactor 110 is about 112 kW. It will be understood, however, that the reactor 110 may have a greater or lesser power capacity depending on the size of the substrates to be processed in the reactor 110. More generally, the reactor 110 preferably has a power capacity between about 40 kW and 200 kW for processing 200 mm substrates, and between about 60 kW and 300 kW for processing 300 mm substrates.

The upper and lower heating lamps 120, 122 are preferably high intensity tungsten filament lamps, each comprising a transparent quartz envelope containing a halogen gas, such as iodine. Such lamps produce full-spectrum radiant heat energy that is transmitted through the walls 113, 114 of the process chamber 112 without appreciable absorption. As is known in the art, the power of the various lamps 120, 122 can be controlled independently or in grouped zones.

Reflectors (not shown) may be provided above the upper heating lamps 120 and/or below the lower heating lamps 122 to help focus radiant energy towards the substrate 131. The reflectors may comprise curved reflective surfaces which may, for example, be etched or dimpled to diffuse and reflect radiation emitted from the heating lamps 120, 122 towards the substrate 131. The reflectors may be provided adjacent all of the heating lamps 120, 122, or only certain of the heating lamps 120, 122, such as the peripheral heating lamps 120, 122, to help compensate for the increased heat loss of the substrate 131 at the edge portion of the substrate 131.

As illustrated in FIG. 2, the substrate 131 is preferably supported within the process chamber 112 on a substrate support 130. In the embodiment illustrated, the support 130 comprises a support spider 133 and a radiation absorbing susceptor 135 upon which the substrate 131 is situated. The spider 133 is a quartz structure mounted to a rotatable shaft 140 that extends downwardly through a tube 142 depending from the chamber 112. The support 130 is preferably rotated during processing of the substrate 131 to improve temperature uniformity across the substrate 131.

In the exemplary reactor 110 of FIG. 2, a divider 115 is provided between the upper wall 113 and the lower wall 111. An outlet port 147 and an inlet port 148 are provided at the sides of the process chamber 112, defining a gas flow path over the substrate support 130. Thus, the chamber 112 is described as a single pass, horizontal-flow CVD chamber. Reference is made to U.S. Pat. No. 4,836,138, issued Jun. 6, 1989, and U.S. Pat. No. 4,828,224, issued May 9, 1989, both of which are hereby incorporated by reference, which provide background information regarding cold-wall, single substrate CVD reactors.

A number of temperature sensors 151, 152 are positioned in proximity to the substrate 131 to monitor the temperature of the substrate 131 during processing. The temperature sensors 150 may be of a variety of different types, including optical pyrometers and thermocouples. Preferably, the temperature sensors 151, 152 are provided at various locations near the substrate 131 to allow the temperature uniformity of the substrate 131 to be monitored during processing.

In the illustrated embodiment, the temperature sensors 151, 152 comprise thermocouples. A first or central thermocouple 152 is suspended below substrate support 130 in a suitable fashion. The illustrated central thermocouple 152 passes through the spider 133 in proximity to the susceptor 135. A plurality of secondary or peripheral thermocouples 151 are also provided near the substrate 131. As is well known in the art, the thermocouples 151, 152 directly supply a voltage to a temperature controller (not shown), such as a PID controller, as an indicator of temperature. The controller preferably can adjust the power of the various heating lamps 120, 122, 124 in response to the voltage outputs of the thermocouples 151, 152.

The peripheral thermocouples 151 are preferably housed within a slip ring 160, which surrounds the substrate support 130 and the substrate 131. The slip ring 160 can be suspended in the chamber 112 by any suitable means. For example, in the illustrated embodiment, the slip ring 160 rests on elbows 162, which depend from the divider 115. In addition to housing the peripheral thermocouples 151, the slip ring 160 absorbs and radiates heat during processing of the substrate 131, thereby reducing the heat loss at the edge of the substrate 131.

In the embodiment illustrated in FIG. 2, a focusing lens 170 is provided between the heating lamps 120 of the upper heating assembly 116 and the substrate 131. In the embodiment shown, the lens 170 is provided on an upper surface of the upper wall 113. Those skilled in the art will recognize, however, that the lens 170 could alternatively be provided on a lower surface of the upper wall 113, or could comprise a separate component positioned either above or below the upper wall 113. Preferably, as illustrated in FIG. 2, the lens 170 is formed integrally with the upper wall 113.

The lens 170 preferably is annular, as illustrated in FIG. 2, and is centered over the substrate 131 to focus radiation from the heating lamps 120 onto the edge portion of the substrate 131. As is well known in the art, the shape of the lens 170 (e.g., the convexity/concavity of the lens 170) and/or the distance of the lens 170 from the substrate 131 can be modified so that radiation is focused onto the edge portion of the substrate 131, as desired. Preferably, the lens 170 focuses radiation onto approximately the outer 25 mm periphery of the substrate 131, and more preferably the outer 5 mm periphery of the substrate 131. The focal length of the lens 170 is preferably between about 0.75H and 1.25H, where H is the distance between the substrate 131 and the lower surface of the upper wall 113. In the illustrated embodiment, the distance H is 20 mm, and the focal length of the lens 170 is approximately 23 mm.

Figure 1:
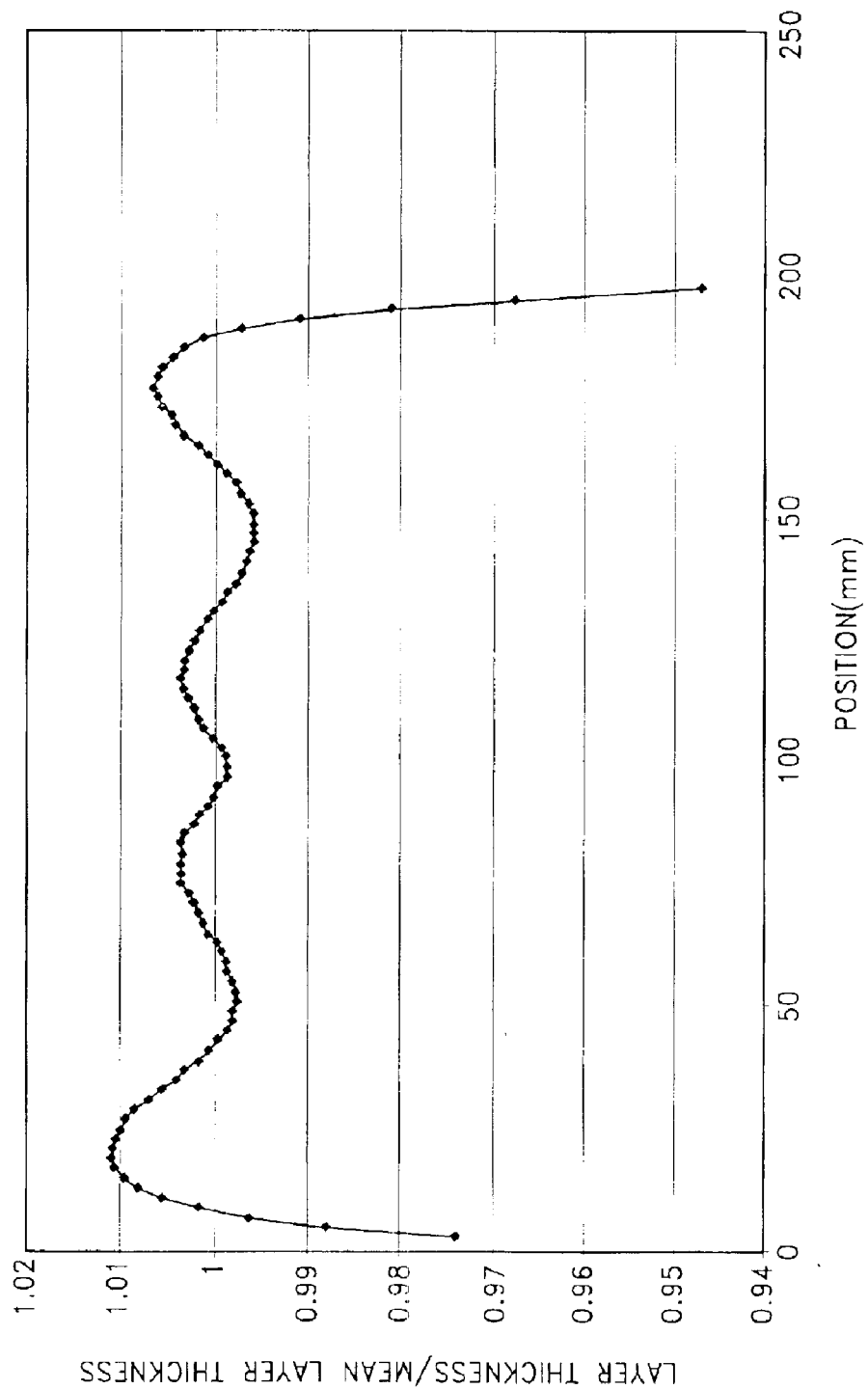
FIG. 1 is a graph plotting layer thickness divided by mean layer thickness against wafer position after a typical CVD process using prior art hardware and processing-techniques.

By focusing radiation onto the edge portion of the substrate 131, the temperature at the edge portion of the substrate 131 can be increased to offset the various phenomena that tend to reduce the growth rate at the edge portion. The increased temperature at the edge portion of the substrate 131 increases the growth rate at the edge portion without substantially increasing the growth rate inward of the edge portion. As a result, the previously observed edge rolloff effect (see FIG. 1) is reduced, and the area of the substrate 131 having an acceptable deposition thickness is increased.

Those skilled in the art will recognize that in addition to, or instead of, the focusing lens 170 positioned between the heating lamps 120 of the upper heating 116 assembly and the substrate 131, as illustrated in FIG. 2, a focusing lens (not shown) could be provided between the heating lamps 122 of the lower heating assembly 118 and the substrate 131. The lens preferably would be similar to the lens 170 illustrated in FIG. 2, but would be provided on or near the lower wall 114 of the process chamber 112 and shaped to focus radiation from the heating lamps 122 of the lower heating assembly 118 onto an area of the susceptor 135 directly below the edge portion of the substrate 131. The temperature, and thus the growth rate, at the edge portion of the substrate 131 would thereby desirably be increased.

Figure 3:
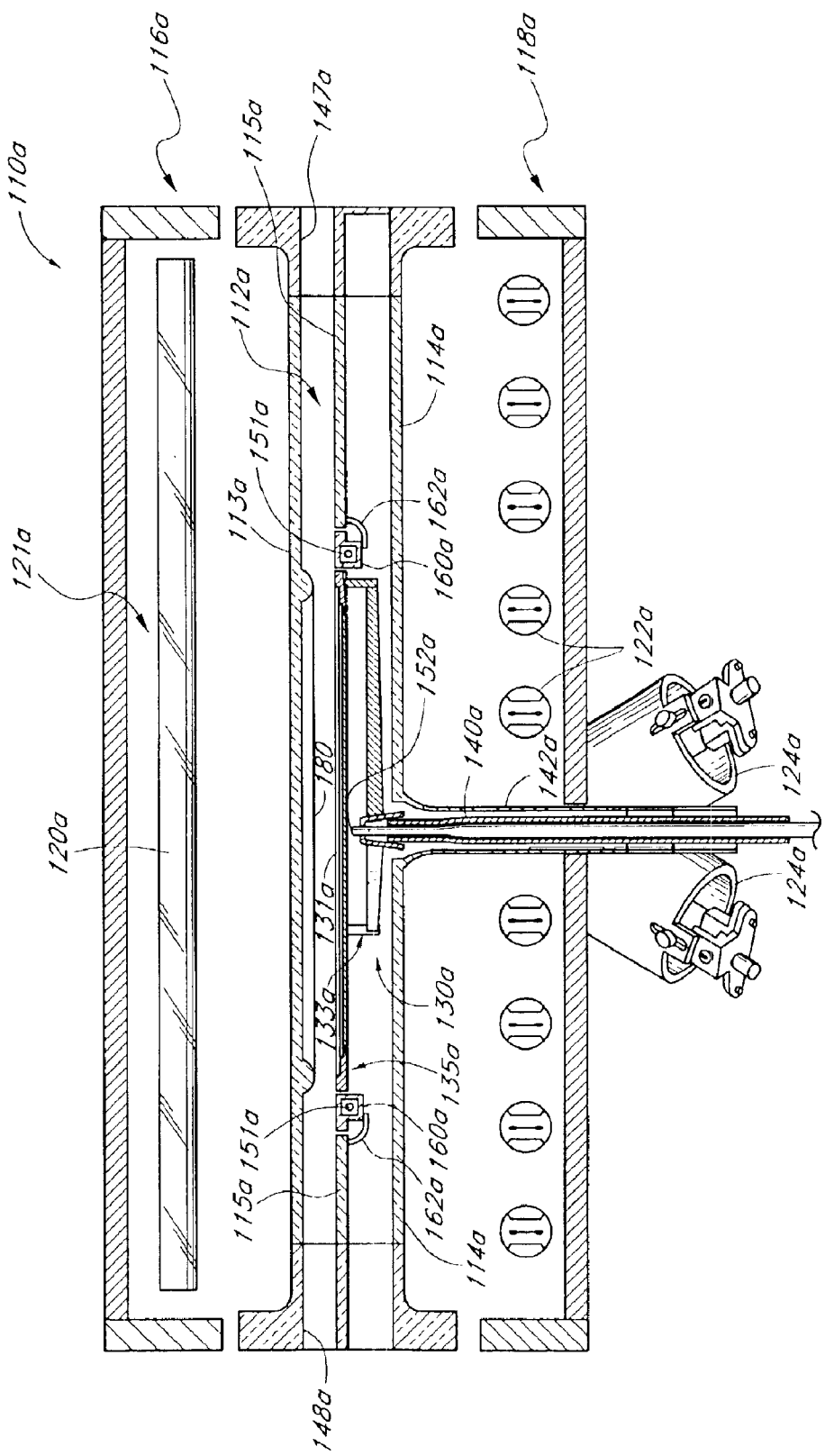
FIG. 3 is a schematic cross-sectional view of a second embodiment of a reactor having certain features and advantages in accordance with the present invention.

With reference now to FIG. 3, a second reactor embodiment 110a is illustrated. For purposes of illustration, the reactor 110a of FIG. 3 is substantially identical to the reactor 110 of FIG. 2, with one principal exception, to be described below. Accordingly, the components of the reactor 110a that are similar to the components of the reactor 110 of FIG. 2 are indicated with similar reference numerals, except that the suffix "a" has been added.

In the reactor 110a of FIG. 3, instead of the focusing lens 170 of FIG. 2, a diffusing lens 180 is provided between the heating lamps 120a of the upper heating assembly 116a and the substrate 131a. In the embodiment shown, the lens 180 is provided on the lower surface of the upper wall 113a of the process chamber 112a. Those skilled in the art will recognize, however, that the lens 180 could alternatively be provided on the upper surface of the upper wall 113a, or could comprise a separate component positioned above or below the upper wall 113a. Preferably, as illustrated in FIG. 3, the lens 180 is formed integrally with the upper wall 113a.

Like the focusing lens 170 of the reactor 110 of FIG. 2, the diffusing lens 180 of the reactor 110a of FIG. 3 is preferably annular, and is centered over the substrate 131a. The diffusing lens 180, however, is positioned above the substrate 131a inwardly of the edge portion of the substrate 131a. The lens 180 is shaped to diffuse radiation from the heating lamps 120a to reduce the intensity of radiation incident on the portion of the substrate 131a just inward of the edge portion of the substrate 131a. As is well known in the art, the shape of the lens 180 (e.g., the convexity/concavity of the lens 180) and/or the distance of the lens 180 from the substrate 131a can be adjusted so that the radiation is diffused, as desired. Preferably, the lens 180 reduces the intensity of radiation incident on a portion of the substrate 131a extending from an outer boundary at about 5 mm to 25 mm from the edge of the substrate to an inner boundary at about 15 mm to 50 mm from the edge of the substrate. More preferably, the lens 180 reduces the intensity of radiation incident on a portion of the substrate 131a extending from an outer boundary at about 10 mm to 20 mm from the edge of the substrate to an inner boundary at about 25 mm to 40 mm from the edge of the substrate.

By reducing the intensity of the radiation incident on the annular band of the substrate 131a spaced inward of the edge portion of the substrate 131a, the temperature of the substrate 131a inward of the edge portion can be reduced, thereby reducing the growth rate. As a result, the thickness of the deposited layer is made more uniform across the substrate 131a.

Those skilled in the art will recognize that in addition to, or instead of, the diffusing lens 180 positioned between the heating lamps 120a of the upper heating assembly 116a and the substrate 131a, as illustrated in FIG. 3, a diffusing lens (not shown) could be provided between the heating lamps 122a of the lower heating assembly 118a and the substrate 131a. The lens preferably would be similar to the lens 180 illustrated in FIG. 3, but would be provided on or near the lower wall 114a of the process chamber 112a and shaped to diffuse radiation from the heating lamps 122a of the lower heating assembly 118a to reduce the intensity of radiation incident on an area of the susceptor 135a directly below the portion of the substrate 131 inward of the edge portion. The temperature, and thus the growth rate, at that portion of the substrate 131 would thereby desirably be reduced.

Figure 4:
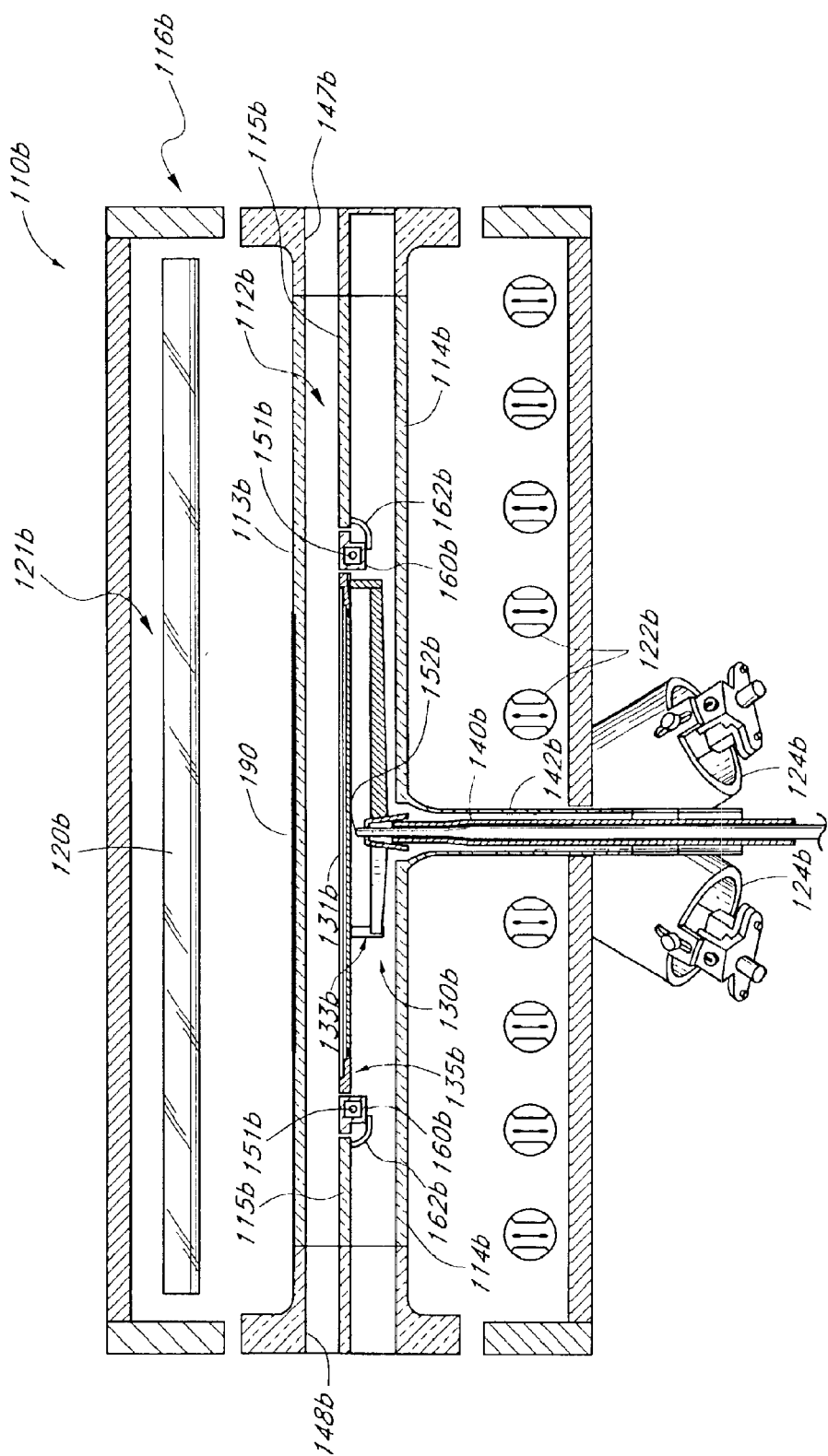
FIG. 4 is a schematic cross-sectional view of a third embodiment of a reactor having certain features and advantages in accordance with the present invention.

A third reactor embodiment 110b is illustrated in FIG. 4. For purposes of illustration, the reactor 110b of FIG. 4 is substantially identical to the reactors 110, 110a of FIGS. 2 and 3, with one principal exception, to be described below. Accordingly, the components of the reactor 110b that are similar to the components of the reactors 110, 110a of FIGS. 2 and 3 are indicated with similar reference numerals, but with the suffix "b."

In the reactor 110b of FIG. 4, instead of the focusing lens 170 of FIG. 2 or the diffusing lens 180 of FIG. 3, a diffusing surface 190 is provided between the heating lamps 120b of the upper heating assembly 116b and the substrate 131b. In the embodiment shown, the diffusing surface 190 is provided on the upper surface of the upper wall 113b. Those skilled in the art will recognize, however, that the diffusing surface 190 could alternatively be provided on the lower surface of the upper wall 113b, or could comprise a separate component positioned either above or below the upper wall 1113b.

The upper and lower walls 113b, 114b of the process chamber 112b preferably comprise a material that can be readily etched or roughened, such as quartz or silicon carbide. In the illustrated embodiment, the walls 113b, 114b are quartz. The diffusing surface 190 preferably comprises a roughened or etched surface of the upper wall 113b. The diffusing surface 190 can be formed, for example, by chemically etching or frosting, mechanically grinding, sandblasting or bead-blasting the upper wall 113b to roughen, or stipple, the surface of the upper wall 113b. By way of example, the diffusing surface 190 could comprise SST (Special Surface Treatment) quartz. This known type of quartzware, which is available from Heraeus Quarzglas of Germany, is produced using a wet etch chemistry consisting of HF and organic acids. Preferably, the diffusing surface 190 reduces the intensity of radiation incident on a portion of the substrate 131b by at least about 10 percent, and more preferably by at least about 25 percent.

The diffusing surface 190 is provided above only a portion of the substrate 131b, with the remainder of the wall 113b being planar and smooth. In the embodiment illustrated in FIG. 4, the diffusing surface 190 is provided on the upper wall 113b directly above the interior surface of the substrate 131b, excluding only the edge portion of the substrate 131b. The diffusing surface 190 serves to diffuse radiation from the heating lamps 120b to reduce the intensity of radiation incident on the entire interior portion of the substrate 131b. Preferably, the diffusing surface 190 reduces the intensity of radiation incident on all but approximately the outer 5 mm to 25 mm periphery of the substrate 131b, and more preferably all but the outer 10 mm to 15 mm periphery of the substrate 131b.

Because the diffusing surface 190 is provided above the interior portion of the substrate 131b, the temperature, and thus the growth rate, at the interior portion of the substrate 131b is reduced relative to the growth rate at the edge portion of the substrate 131b. The various phenomena that tend to reduce the growth rate at the edge portion of the substrate 131b are thereby offset. The power supplied to the heating lamps 120b, 122b may be increased, as necessary, to achieve the desired temperature at the interior of the substrate 131b.

Those skilled in the art will recognize that in addition to, or instead of, the diffusing surface 190 provided between the heating lamps 120b of the upper heating assembly 116b and the substrate 131b, as illustrated in FIG. 4, a diffusing surface (not shown) could be provided between the heating lamps 122b of the lower heating assembly 118b and the substrate 131b. The diffusing surface preferably would be similar to the diffusing surface 190 illustrated in FIG. 4, but would be provided on or near the lower wall 114b of the process chamber 112b to diffuse radiation from the heating lamps 122b of the lower heating assembly 118b. The intensity of the radiation incident on a predetermined area of the susceptor 135b, and thus the temperature of the substrate 131b above that area of the susceptor 135b, could thereby be reduced, as desired.

Figure 5:
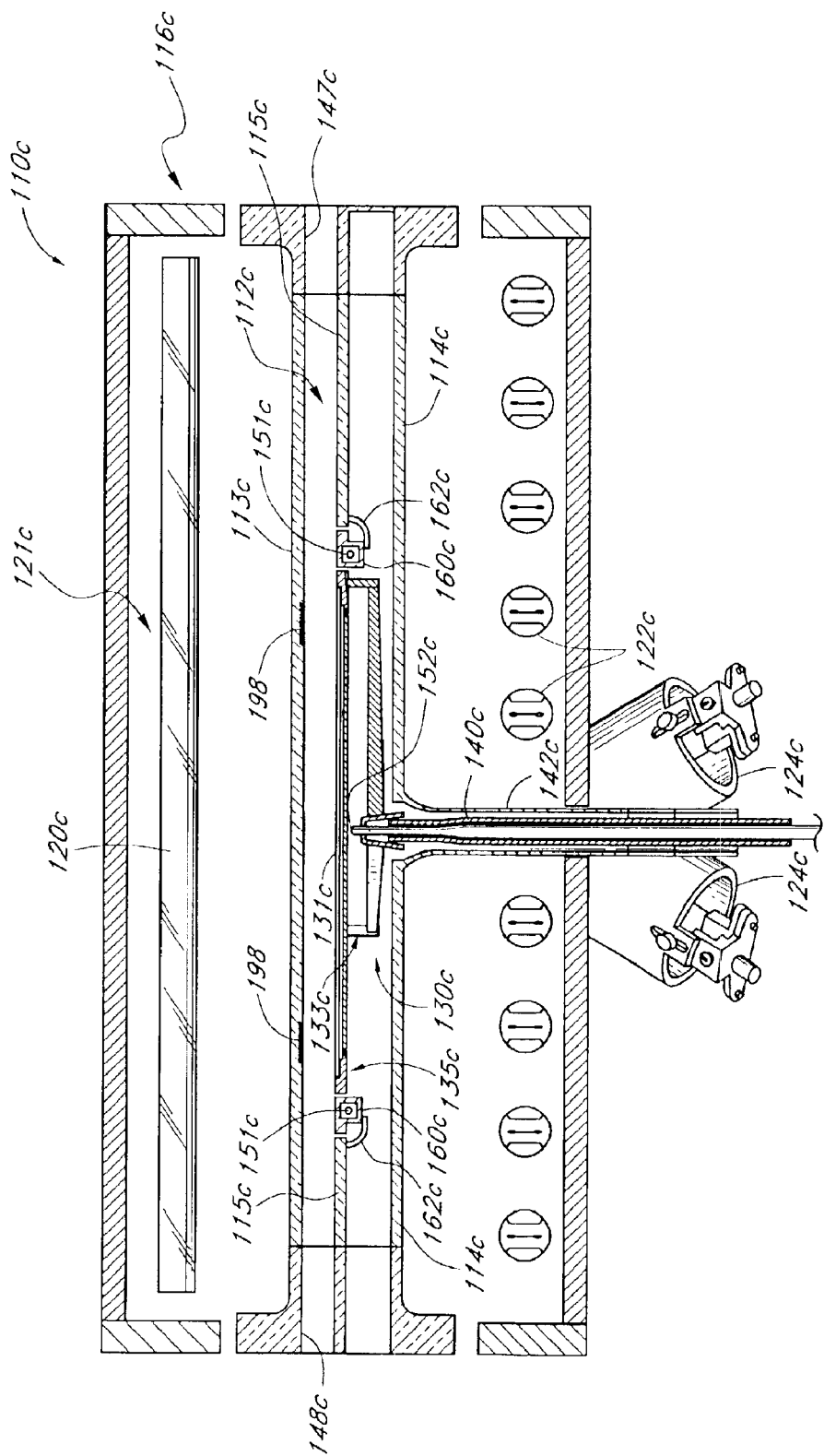
FIG. 5 is a schematic cross-sectional view of a fourth embodiment of a reactor having certain features and advantages in accordance with the present invention.

With reference now to FIG. 5, a fourth reactor embodiment 110c is illustrated. For purposes of illustration, the reactor 110c of FIG. 5 is substantially identical to the reactors 110, 110a, 110b of FIGS. 2, 3 and 4, with one principal exception, to be described below. Accordingly, the components of the reactor 110c that are similar to the components of the reactors 110, 110a, 110b of FIGS. 2, 3 and 4 are indicated with similar reference numerals, but with the suffix "c."

In the embodiment of FIG. 5, a diffusing surface 198 is provided on a lower surface of the upper wall 113c in an annular pattern above only the portion of the substrate 131c inward of the edge portion of the substrate 131c. Preferably, the diffusing surface 198 reduces the intensity of radiation incident on a portion or band of the substrate 131c extending from an outer boundary at about 5 mm to 25 mm from the edge of the substrate to an inner boundary at about 15 mm to 50 mm from the edge of the substrate. More preferably, the diffusing surface 198 reduces the intensity of radiation incident on a portion of the substrate 131c extending from an outer boundary at about 10 mm to 20 mm from the edge of the substrate to an inner boundary at about 25 mm to 40 mm from the edge of the substrate.

Because the diffusing surface 198 is provided in an annular pattern above the portion of the substrate 131c inward of the edge portion, the intensity of the radiation incident on that portion of the substrate 131c is reduced. The temperature, and thus the growth rate, at that portion of the substrate 131c is reduced, offsetting the pattern shown in FIG. 1 and making more uniform the thickness of the deposited layer across the substrate 131c.

Those skilled in the art will recognize that in addition to, or instead of, the diffusing surface 198 provided between the heating lamps 120c of the upper heating assembly 116c and the substrate 131c, as illustrated in FIG. 5, a diffusing surface (not shown) could be provided between the heating lamps 122c of the lower heating assembly 118c and the substrate 131c. The diffusing surface preferably would be similar to the diffusing surface 198 illustrated in FIG. 5, but would be provided on or near the lower wall 114c of the process chamber 112c to diffuse radiation from the heating lamps 122c of the lower heating assembly 118c. The intensity of the radiation incident on a predetermined area of the susceptor 135c, and thus the temperature of the substrate 131c above that area of the susceptor 135c, could thereby be reduced, as desired.

It will be understood by those skilled in the art that various features of the embodiments illustrated FIGS. 2, 3, 4 and 5 can be combined in a single reactor. For example, the focusing lens 170 of FIG. 2 could be used in combination in a single reactor with the diffusing lens 180 of FIG. 3, the diffusing surface 190 of FIG. 4, or the diffusing surface 198 of FIG. 5 to achieve the advantages of the various embodiments is a single reactor.

Accordingly, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. It is further contemplated that various combinations and sub-combinations of the specific features and aspects of the embodiments may be made and still fall within the scope of the invention. Accordingly, it is intended that the scope of the present invention herein disclosed should not be limited by the particular disclosed embodiments described above, but should be determined only by a fair reading of the claims that follow.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

We claim:

1. An apparatus for processing a semiconductor substrate, comprising:
    a process chamber having a plurality of walls;
    a substrate support to support the substrate within the process chamber;
    a radiative heat source positioned outside the process chamber to heat the substrate through the walls when the substrate is positioned on the substrate support; and
    a lens provided between the heat source and the substrate when the substrate is positioned on the substrate support, the lens focusing an intensity of radiation from the heat source incident on a portion of the substrate.

2. The apparatus of claim 1, wherein the lens is annular.

3. The apparatus of claim 2, wherein the lens is provided on one of the walls of the process chamber.

4. The apparatus of claim 3, wherein the lens is formed integrally with an upper wall of the process chamber.

5. The apparatus of claim 4, wherein the lens is adapted to focus radiation from the heat source towards an edge portion of the substrate.

6. The apparatus of claim 5, wherein the lens is adapted to focus radiation onto approximately an outer 25 mm periphery of the substrate.

7. The apparatus of claim 5, wherein the lens is adapted to focus radiation onto approximately an outer 5 mm periphery of the substrate.

8. The apparatus of claim 5, further comprising a diffusing surface provided between the heat source and the substrate when the substrate is positioned on the substrate support, the diffusing surface being adapted to diffuse radiation from the heat source to reduce an intensity of radiation incident on a portion of the substrate inward of the edge portion.

9. An apparatus for processing a semiconductor substrate, comprising:
    a process chamber having a plurality of walls;
    a substrate support to support the substrate within the process chamber;
    a radiative heat source positioned outside the process chamber to heat the substrate through the walls when the substrate is positioned on the substrate support; and
    a lens provided between the heat source and the substrate when the substrate is positioned on the substrate support, the lens affecting an intensity of radiation from the heat source incident on a portion of the substrate and the lens being adapted to focus radiation from the heat source towards an edge portion of the substrate; and
    a second lens provided between the heat source and the substrate when the substrate is positioned on the substrate support, the second lens being adapted to diffuse radiation from the heat source to reduce an intensity of radiation incident on a portion of the substrate inward of the edge portion.

10. An apparatus for processing a semiconductor substrate, comprising:
    a process chamber having a plurality of walls;
    a substrate support to support the substrate within the process chamber;
    a radiative heat source positioned outside the process chamber to heat the substrate through the walls when the substrate is positioned on the substrate support; and
    a diffusing surface provided on a portion of at least one of the walls, the diffusing surface diffusing radiation from the heat source to reduce an intensity of radiation incident on a portion of the substrate and the diffusing surface is provided in an annular pattern above a portion of the substrate inward of an edge portion.

11. The apparatus of claim 10, wherein the diffusing surface is adapted to reduce the intensity of radiation incident on an annular portion of the substrate extending from an outer boundary at about 5 mm to 25 mm from the edge of the substrate to an inner boundary at about 15 mm to 50 mm from the edge of the substrate.

12. The apparatus of claim 10, wherein the diffusing surface is adapted to reduce the intensity of radiation incident on an annular portion of the substrate extending from an outer boundary at about 10 mm to 20 mm from the edge of the substrate to an inner boundary at about 25 mm to 40 mm from the edge of the substrate.

13. The apparatus of claim 10, wherein the diffusing surface comprises a roughened area on an upper wall of the process chamber.

14. The apparatus of claim 13, wherein the diffusing surface reduces the intensity of radiation incident on the portion of the substrate by at least about 10 percent.

15. The apparatus of claim 13, wherein the diffusing surface reduces the intensity of radiation incident on the portion of the substrate by at least about 25 percent.

16. An apparatus for processing a semiconductor substrate, comprising:

a process chamber having a plurality of walls;

a substrate support to support the substrate within the process chamber;

a radiative heat source positioned outside the process chamber to heat the substrate through the walls when the substrate is positioned on the substrate support; and a diffusing surface provided on a portion of at least one of the walls, the diffusing surface diffusing radiation from the heat source to reduce an intensity of radiation incident on a portion of the substrate, wherein the diffusing surface comprises a roughened area on an upper wall of the process chamber, and wherein the diffusing surface is provided above an entire interior portion of the substrate excluding the edge portion of the substrate.

17. An apparatus for processing a semiconductor substrate, comprising:

a process chamber having a plurality of walls;

a substrate support to support the substrate within the process chamber;

a radiative heat source positioned outside the process chamber to heat the substrate through the walls when the substrate is positioned on the substrate support; and diffusing means for reducing an intensity of radiation from the heat source incident on one portion of the substrate relative to another portion of the substrate, wherein the diffusing means comprises a lens positioned between the heat source and the substrate.

18. The apparatus of claim 17, wherein the diffusing means reduces the intensity of radiation incident on all of the substrate except approximately an outer 5 mm to 25 mm periphery of the substrate.

19. The apparatus of claim 17, wherein the diffusing means reduces the intensity of radiation incident on all of the substrate except approximately an outer 10 mm to 15 mm periphery of the substrate.

20. The apparatus of claim 17, wherein the diffusing means reduces the intensity of radiation incident on an annular portion of the substrate extending from an outer boundary at about 5 mm to 25 mm from the edge of the substrate to an inner boundary at about 15 mm to 50 mm from the edge of the substrate.

21. The apparatus of claim 17, wherein the diffusing means reduces the intensity of radiation incident on an annular portion of the substrate extending from an outer boundary at about 10 mm to 20 mm from the edge of the substrate to an inner boundary at about 25 mm to 40 mm from the edge of the substrate.

* * * * *

UNITED STATES PATENT AND TRADEMARK OFFICE
CERTIFICATE OF CORRECTION

PATENT NO. : 6,879,777 B2
DATED : April 12, 2005
INVENTOR(S) : Goodman et al.

It is certified that error appears in the above-identified patent and that said Letters Patent is hereby corrected as shown below:

Column 7,
Line 46, please replace "1113b" with -- 113b --.

Signed and Sealed this

Fifteenth Day of November, 2005

JON W. DUDAS
*Director of the United States Patent and Trademark Office*